United States Patent [19]
Earl et al.

[11] Patent Number: 5,632,667
[45] Date of Patent: May 27, 1997

[54] NO COAT BACKSIDE WAFER GRINDING PROCESS

[75] Inventors: Michael R. Earl; Russell A. Detterich, both of Kokomo; Robert A. Yancey, Carmel, all of Ind.

[73] Assignee: Delco Electronics Corporation, Kokomo, Ind.

[21] Appl. No.: 496,333

[22] Filed: Jun. 29, 1995

[51] Int. Cl.⁶ .................................................. B24B 1/00
[52] U.S. Cl. .......................... 451/41; 451/287; 451/388; 451/285
[58] Field of Search ................... 451/41, 8, 285, 451/287, 288, 289, 449, 450, 388, 398, 397, 413

[56] References Cited

U.S. PATENT DOCUMENTS

| | | | |
|---|---|---|---|
| 3,342,652 | 9/1967 | Reisman et al. | 451/288 |
| 3,740,900 | 6/1973 | Youmans et al. | 451/388 |
| 4,009,540 | 3/1977 | Uijen | 451/388 |
| 4,183,781 | 1/1980 | Eldridge et al. | 156/643 |
| 4,292,039 | 9/1981 | Farris et al. | 23/230 |
| 4,343,662 | 8/1982 | Gay | 148/187 |
| 4,451,972 | 6/1984 | Batinovich | 29/589 |
| 4,510,672 | 4/1985 | Yakura | 29/574 |
| 4,597,228 | 7/1986 | Koyama et al. | 451/289 |
| 4,654,147 | 3/1987 | Bagley | 210/744 |
| 4,693,036 | 9/1987 | Mori | 451/287 |
| 4,900,363 | 2/1990 | Brahem et al. | 134/3 |
| 5,078,801 | 1/1992 | Malik | 451/285 |
| 5,288,332 | 2/1994 | Pustilnik et al. | 134/27 |
| 5,329,734 | 7/1994 | Yu | 451/41 |
| 5,362,681 | 11/1994 | Roberts, Jr. et al. | 437/226 |
| 5,461,008 | 10/1995 | Sutherland et al. | 437/226 |

FOREIGN PATENT DOCUMENTS

| | | | |
|---|---|---|---|
| 56-126927 | 5/1981 | Japan | H01L 21/78 |
| 56-126938 | 5/1981 | Japan | H01L 21/78 |
| 3-227556 | 8/1991 | Japan | H01L 21/78 |
| 5-335412 | 12/1993 | Japan | H01L 21/78 |

OTHER PUBLICATIONS

S. Mayumi, et al, "Corrosion–Induced Contact Failures in Double–Level Al–Si–Cu Metallization," *Journal of the Electrochemical Society*, v137, n6, pp. 1861–1867 Jun. 1990.

Wen–Yang Lee, "Reactive Ion Etching Induced Corrision of Al and Al–Cu Films," *Journal of Applied Physics*, v 52, n4, pp. 2994–2999, Apr. 1981.

*Primary Examiner*—James G. Smith
*Assistant Examiner*—Dona C. Edwards
*Attorney, Agent, or Firm*—Jimmy L. Funke

[57] ABSTRACT

A silicon wafer grinding apparatus for grinding a backside surface of a semiconductor wafer that includes integrated circuit chips patterned on a frontside surface of the wafer. The apparatus includes a plurality of chuck tables that secure a plurality of wafers to be ground. Each chuck table includes a cushioned rubber pad secured to the table and an interface with the frontside surface of the wafer. An organic acid cooling fluid is utilized during the grinding procedure to prevent silicon particles and residue from being adhered to the metal bond pads of the integrated circuit chips.

19 Claims, 2 Drawing Sheets

NO COAT BACKSIDE WAFER GRINDING PROCESS

BACKGROUND OF THE INVENTION

1. Field of the Invention

This invention is related generally to an apparatus and method for grinding a backside surface of an integrated circuit wafer and, more particularly, to an apparatus and method for grinding a backside surface of an integrated circuit wafer that includes use of a cushioned grinding table and an organic acid cooling fluid.

2. Discussion of the Related Art

In a typical integrated circuit manufacturing process, a plurality of integrated circuit chips are simultaneously patterned and defined on a frontside surface of a single silicon wafer by a series of layer deposition and etching processes well understood in the art. The individual integrated circuit chips are generally patterned in a series of rows and columns in a rectangular format on the wafer. After the integrated circuit chips are fully defined, the wafer is then diced by a suitable sawing machine along lines between the rows and columns of the integrated circuit pattern to separate the wafer into the individual circuits. The individual integrated circuit chips can then be secured within protective packages and incorporated into appropriate electronic circuits.

U.S. patent application Ser. No. 08/249,815 filed May 26, 1994, titled "Method of Preventing Aluminum Bond Pad Corrosion During Dicing of Integrated Circuit Wafers," assigned to the assignee of the instant application and herein incorporated by reference, discloses a method of preventing metal bond pad corrosion and contamination during dicing of integrated circuit wafers. This method incorporates use of an organic acid cooling fluid that cools a saw blade of the sawing machine during dicing. The pH level of the cooling fluid established by the organic acid prevents silicon residue and particulates released from the wafer during the sawing process from adhering to metallic bond pads of the individual integrated circuit chips, and thus allows the silicon particulates to be washed away from the wafer with the cooling fluid.

Generally, the original silicon wafer on which the integrated circuits are patterned is sliced from a larger silicon crystal ingot. The silicon wafers are sliced from the crystal ingot to a thickness that is greater than desirable for a finished integrated circuit product so as to provide a more robust wafer to stand up to the rigors of the integrated circuit fabrication processes. Particularly, relatively thick silicon wafers are necessary during the integrated circuit fabrication steps to prevent warpage and breakage of the wafer as a result of certain heating processes, as well as other circuit fabrication processes. However, the thickness of the wafer after the integrated circuits are fabricated is thicker than desirable for device packaging restrictions. Therefore, it is necessary after the integrated circuit patterns are defined to grind a backside surface of the wafer opposite to the frontside surface of the wafer where the integrated circuits are formed to reduce the wafer thickness prior to the wafer being diced to separate the wafer into the individual integrated circuit chips. Suitable grinding machines are well known in the art that are capable of grinding down the backside surface of the silicon wafer. Known types of grinding machines generally include a plurality of chuck tables that secure a plurality of wafers to be ground by one or more grinding wheels.

The current industry standard is to apply either a spin-on coating of a resist material, or other applicable material, or a dry film tape to the frontside of the finished integrated circuit chip wafer to cover and protect the integrated circuits during the backside grinding process. The frontside protective cover of the integrated circuit chip wafer prevents silicon residue contaminants from adhering to the metallic bond pads of the integrated circuits during grinding. Once the grinding process is complete, the spin-on coating is etched away in a wet bath, or an applicable machine is used to remove the dry film tape.

Although the spin-on coating or dry film tape has effectively prevented silicon residue from contaminating the bond pads during grinding, removal of the spin-on coating or dry film tape has resulted in contamination of the integrated chips by residue from the coating or tape. This contamination can cause integrated circuit device failures or poor test yields. Also, the chuck table applies pressure to the frontside surface of the silicon wafers where the integrated circuit chips are formed to hold the wafer in place. This pressure sometimes causes damage to the integrated circuit chips because epitaxial spikes or foreign material are formed during device layer deposition. Although the spin-on coating or dry film tape provides some cushioning against damage of this nature, the thickness of the coating or tape is not enough to protect the integrated circuit chips against many epitaxial spikes and other foreign material commonly present from integrated circuit fabrication.

What is needed is a method and associated apparatus that allows grinding of a backside surface of a silicon wafer that does not cause pressure damage to the integrated circuit chips on a frontside surface of the wafer, and does not allow contamination of the integrated circuit chips and associated metallic bond pads during the grinding process. It is therefore an object of the present invention to provide such an apparatus and process.

SUMMARY OF THE INVENTION

In accordance with the teachings of the present invention, a method and associated apparatus is disclosed for grinding a backside surface of a semiconductor wafer that includes integrated circuit chips patterned on a frontside surface of the wafer. The process utilizes a known grinding machine that includes a plurality of rigid chuck tables that secure a plurality of wafers to be moved relative to a series of grinding surfaces. The chuck tables each include a cushioned rubber pad secured to the table at an interface with the frontside surface of the wafer. The cushion rubber pad is thick enough to prevent imperfections in the frontside surface of the silicon wafer resulting from device fabrication from causing damage to the integrated circuit chips under the pressure that holds the chips to the chuck tables. An organic acid cooling fluid is utilized during the grinding procedure to prevent particulates and residue released from the wafer during the grinding from adhering to the metal bond pads of the integrated circuit chips.

Additional objects, advantages, and features of the present invention will become apparent from the following description and appended claims, taken in conjunction with the accompanying drawings.

DETAILED DESCRIPTION OF THE PREFERRED EMBODIMENTS

The following discussion of the preferred embodiments directed to an integrated circuit wafer backside grinding apparatus and method is merely exemplary in nature and is in no way intended to limit the invention or its applications or uses.

Figure 1:
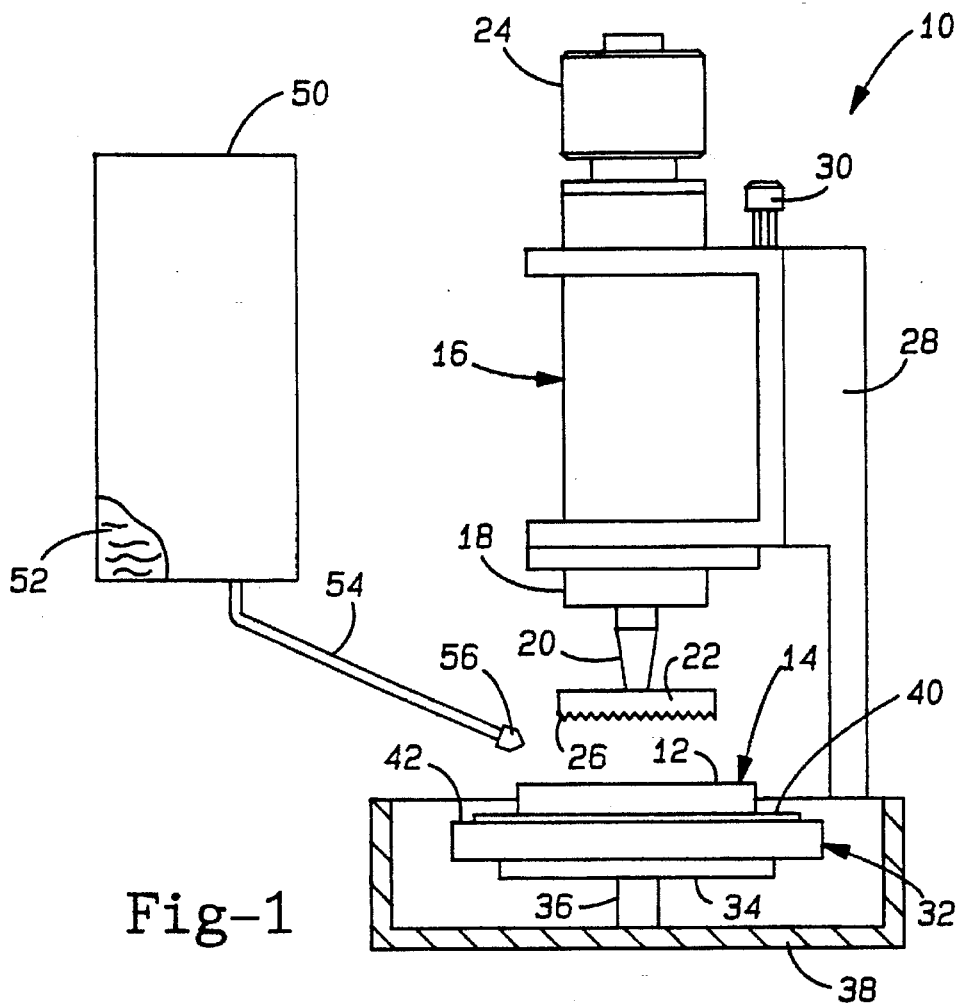
FIG. 1 is a plan view of an integrated circuit wafer backside grinding machine including a cushioned chuck table and an organic acid cooling fluid source according to an embodiment of the present invention.

First turning to FIG. 1, a plan view of a grinding machine 10 suitable to grind a backside surface 12 of an integrated circuit wafer 14 is shown. The grinding machine 10 is intended to represent any known applicable grinding machine in the art that is used to grind a backside surface of an integrated circuit wafer. For example, the grinding machine 10 can be the DISCO Rotary Surface Grinder Model DFG-83H/6 available from Disco Hi-Tech America, known to those skilled in the art. The wafer 14 can be any applicable semiconductor wafer that includes patterned integrated circuits (not shown) defined on a frontside surface of the wafer 14. The discussion below is directed to a silicon wafer, however, as will be appreciated by those skilled in the art, other semiconductor wafers are applicable within the scope of the invention.

The grinding machine 10 includes a spindle housing 16. The spindle housing 16 includes a spindle 18 having a rotatable grinding shaft 20 and a grinding wheel 22 rigidly secured to an end of the shaft 20 as shown. A spindle motor 24 rotates the shaft 20, and thus the grinding wheel 22 during the grinding process such that diamond teeth 26 associated with the grinding wheel 22 operate to grind away semiconductor material from the backside surface 12 of the wafer 14. The spindle housing 16 is secured to a slider 28 that includes an adjustable bolt 30 such that the height of the grinding wheel 22 can be adjusted relative to the wafer 14 so as to provide different degrees of grinding.

The wafer 14 is secured to a ceramic chuck table 32 by a suitable securing mechanism such as vacuum suction, as is well understood in the art, such that the frontside of the wafer 14 that includes the integrated circuits is positioned against the chuck table 32. The chuck table 32 is secured to a chuck table platform 34. The chuck table platform 34 is secured to a shaft 6 positioned within a tray 38. The tray 38 is shown in cross-section in order to expose the chuck table 32. A cushion pad 40, according to the invention, is attached to a top surface 42 of the chuck table 32 by a suitable securing mechanism such as an adhesive. Other types of securing mechanisms, such as tape, would also be applicable to secure the cushion pad 40 to the chuck table 32. In one embodiment, the cushion pad 40 is a rubber pad about 0.027 of an inch thick. The cushion pad 40 provides cushioning for the frontside surface of the wafer 14 against the rigid chuck table 32 so as to prevent damage to the integrated circuits patterned on the wafer 14. Because the chuck table 32 is generally made of ceramic, and is thus rigid, epitaxial spikes formed within the integrated circuits by the integrated circuit layer deposition steps, and foreign material which may contaminate the circuits from the fabrication processes, may cause scratching and breakage of the integrated circuits when the wafer 14 is secured to the chuck table 32 by the vacuum securing process. By providing the cushion pad 40, these types of defects in the integrated circuits will not damage the integrated circuits under the vacuum pressure.

Figure 2:
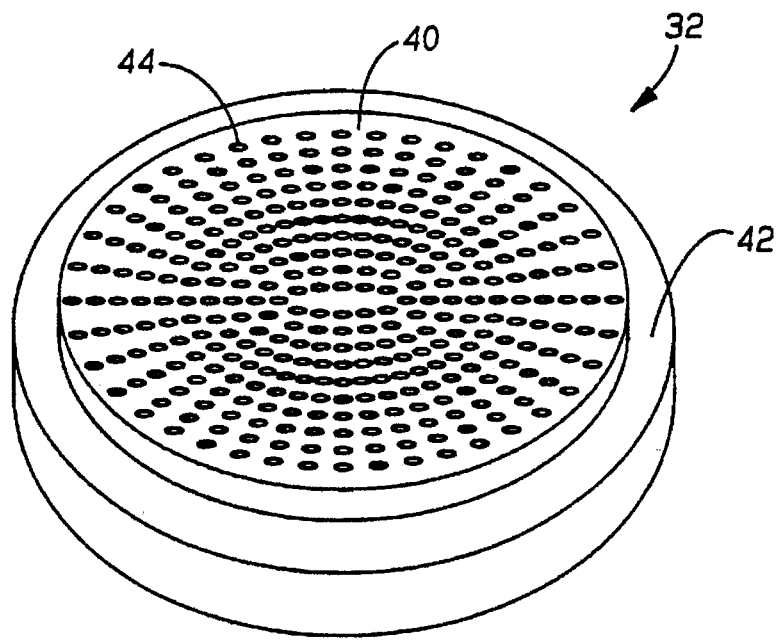
FIG. 2 is a perspective view of a chuck table separated from the grinding machine of FIG. 1.

FIG. 2 shows the chuck table 32 removed from the remaining parts of the grinding machine 10. In this Figure, the wafer 14 is not secured to the chuck table 32. As is apparent, the cushion pad 40 includes a plurality of strategically placed holes 44 that extend through the entire thickness of the cushion pad 40. The holes 44 align with holes (not shown) in the top surface 42 of the chuck table 32 to allow suction that is applied to an undersurface of the chuck table 32 to reach the wafer 14. The placement of the holes 44 through the pad 40 can be any suitable pattern that satisfactorily allows vacuum to be applied through the pad 40. Therefore, the configuration of the holes 44 as shown is intended by way of a non-limiting example in that any other number and configuration of holes may be suitable for a different application.

Returning to FIG. 1, the grinding machine 10 also includes a reservoir 50 for storing a cooling fluid 52 that cools the grinding wheel 22 and the wafer 14 during the grinding process. A fluid line 54 extends from the reservoir 50, and includes a nozzle 56 for spraying the fluid 52 at a desirable location and intensity relative to the wheel 22 and the wafer 14. In one embodiment, the cooling fluid 52 is a solution of an organic acid, preferably a citric acid, and deionized water. A more detailed discussion of the properties of the cooling fluid 52 will be given below. In this example, the cooling fluid 52 is delivered to the grinding wheel 22 and the wafer 14 through the fluid line 54 and out of the nozzle 56 in a gravity fed arrangement such that the cooling fluid 52 is applied to a certain area of the grinding machine 10. This configuration is intended to simply show that cooling fluid is necessary for the grinding operation. In a practical environment, however, the cooling fluid 52 will be applied at various locations relative to the grinding wheel 22 and the wafer 14, and in some cases through the spindle shaft 20. The cooling fluid 52 that is sprayed from the nozzle 56 to cool the grinding wheel 22 and the wafer 14 is collected in the tray 38. A drain (not Shown) can be provided in the tray 38 to drain the used cooling fluid 52 to be disposed of appropriately.

The operation of a grinding machine of the type of the grinding machine 10 is well understood in the art. To grind the backside surface 12 of the wafer 14, the motor 24 rotates the grinding wheel 22 at a desirable speed. The spindle housing 16 is lowered on the slide 28, and the chuck table 32 is translationally or rotatably moved such that the wafer 14 is moved under the turning grinding wheel 22. The spindle housing 16 is lowered to the appropriate location so that a desirable amount of the wafer 14 will be removed. As the wafer 14 moves relative to the grinding wheel 22, wafer material is removed from the backside surface 12 of the wafer 14. The cooling fluid 52 sprayed from the nozzle 56 cools the grinding wheel 22 and the wafer 14, and washes away removed particulates. Generally, two or three grinding wheels are provided to gradually grind the backside surface 12 of the wafer 14 to the appropriate thickness. In one particular embodiment, the wafer 14 starts at a thickness of about 22 mils. A first grinding wheel will be used to reduce the thickness of the wafer 14 a few mils, and then a second grinding wheel will be used to remove more of the semiconductor material to reduce the thickness of the wafer 14 to, for example, 17 mils. In certain applications, the wafer 14 is reduced even farther, to, for example, 13 mils. In this embodiment, generally three grinding wheels are required.

Figure 3:
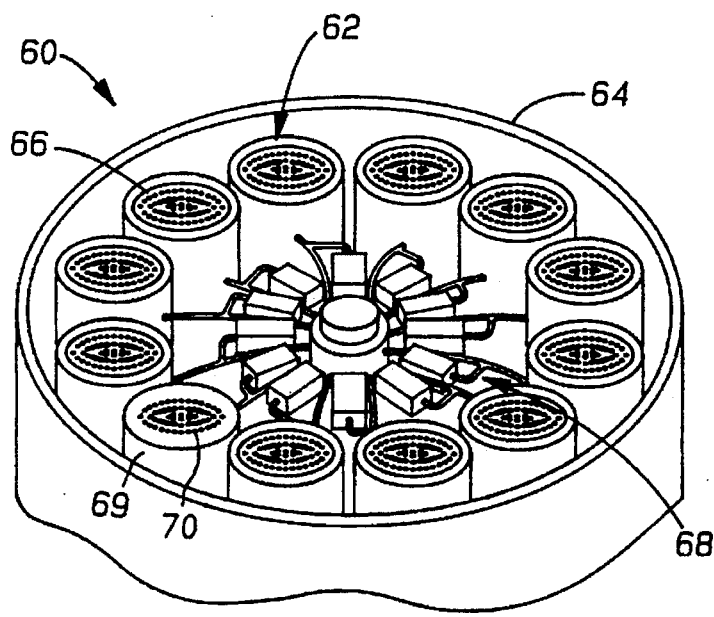
FIG. 3 is a perspective view of a plurality of chuck tables including cushioned pads according to an embodiment of the present invention.

FIG. 3 shows a perspective view of a portion of a practical grinding machine 60. Particularly, the grinding machine 60 shows a plurality of chuck tables 62 circumferentially positioned within a chuck table holder 64. Each of the chuck tables 62 includes a cushion pad 66 of the type of the cushion pad 40 discussed above. A series of control components 68 provide vacuum and other control functions to the chuck tables 62 in a manner that is well understood in the art. The cushion pad has been removed from a chuck table 69 so as to expose a series of openings 70 in a top surface of the chuck table 69. The vacuum control component 68 provides suction to the holes 70, which in turn provides suction to the holes in the cushion pad 66, to hold the wafer on the chuck table 69. During the grinding process, the chuck tables 62 will rotate around a common center relative to the grinding wheels.

For the grinding machine 60, there are twelve chuck tables 62. This type of grinding machine is generally used to grind wafers that are five or six inches in diameter. Generally, other grinding machines that include other numbers of chuck tables are provided for wafers of larger diameters. For example, wafers that are eight inches in diameter would probably be ground on a grinding machine that includes eight chuck tables. The use of the cushion pads 66 would be applicable for any rigid chuck table for any diameter wafer.

The grinding operation of silicon wafers generates extremely fine silicon particles. These particles are of a colloidal size, i.e., about 1 micron and less. The silicon particles are deposited on the surface of metalized bond pads (not shown) associated with the integrated circuits of the wafer 14 during the grinding operation and are not rinsed off under the force of the coolant spray from the nozzle 50. The silicon particles are so fine that they acquire a charge and are strongly adhered to the exposed conductive surface of the bond pads. The bond pads are normally an aluminum or aluminum alloy. The aluminum alloy can be, by weight, 98% aluminum, 1% silicon and 1% copper. It has been recognized that heat treatment of the wafer 14 prior to grinding can cause segregation of copper in this alloy. This can produce sites in the exposed bond pad that have a different galvanic potential than adjacent sites in the exposed bond pad. Such differences can cause galvanic corrosion of the exposed bond pads when they are exposed to a humid environment, and particularly a moist environment. Accordingly, there is a tendency for galvanic erosion during grinding. The presence of the silicon particles in the bond pads can enhance the galvanic corrosion of the copper during the grinding operation.

It appears that an anion of an organic acid can be used as an active agent that prevents contamination of the bond pads of the silicon wafer by silicon residue. An anion in this context is referred to as a negatively charged ion resulting from ionization of an organic acid or from ionization of a salt of an organic acid. For example, the citrate ion would be the active agent for an aqueous solution of citric acid or of sodium citrate. Other organic acid anions would also work, alone and in combination, including anions from acids such as succinic acid, glutaric acid, adipic acid, formic acid, acetic acid, malic acid, malonic acid, oxalic acid and fumaric acid.

It appears that the organic acid anion passivates the bond pads and/or electrically effects the silicon residue particles. This passivation occurs by complexing with the aluminum of the bond pad. Further, the organic acid anion electrically effects the colloidal silicon particles by changing their ionic potential. In this case, the ionic potential of the silicon particles are no longer attracted to the aluminum surface and/or their charge is not great enough to break through the passivation which the anion provides on aluminum surface. These mechanisms work together to inhibit the colloidal silicon particles from sticking to the aluminum bond pad surface of the individual integrated circuit chips. This inhibition inherently also inhibits bond pad corrosion and scratching of the bond pads caused by the silicon particles.

The minimum concentration of the organic acid anion needed to experience a benefit in reducing or eliminating aluminum bond pad contamination appears to vary with the organic acid anion being used. In general, it appears that concentrations above about 0.001 molar (M) of most organic acid anion will destroy the colloidal spension of silicon. With such concentrations of most organic acid anion, the silicon particles would not adhere to the aluminum bond pad, and will precipitate out of the coolant solution. However, a concentration of only about 0.00005M of some organic acid anions appear to be useful. Accordingly, the minimum concentration of the organic acid anion needed to observe a benefit will vary for different applications.

Salts of organic acids also are effective in preventing adhesion of the colloidal particles to the aluminum bond pads. However, the use of salts in this type of application may be objectionable on other grounds. The application of added metal ions, i.e., cations, to the integrated circuit chip surface may be considered objectionable. It should also be recognized that an organic ester is a reaction product of an organic acid and an alcohol. Esters can hydrolyze in water to release the precursor organic acid anion and alcohol. The degree of hydrolysis of course depends on the ester composition and other factors. Therefore, an organic ester could be used as a source of the organic acid anion. It should be noted that the presence of alcohol in the coolant might have some ancillary benefit, for example in reducing surface tension.

When an organic acid is used as a source of the acid anion, the pH of the deionized water coolant is lowered. When citric acid is used as the organic acid in the cooling fluid, a pH of about 3.5–5.5 has been shown to be useful, preferably a pH of about 4.0, to produce the necessary amount of anions in the cooling fluid. Therefore, it has been shown that in order to obtain the desirable concentration of organic acid in the cooling fluid, the pH of the cooling fluid can be measured.

The manner in which the cooling fluid is mixed and then applied to the grinding wheel 22 and the wafer 14 can vary for different applications. As mentioned above, the cooling fluid 52 is a premixture of an organic acid and deionized water to provide a solution of a desirable pH, and is fed to the grinding wheel 22 and the wafer 14 by gravity. In other embodiments, separate reservoirs can be provided for the deionized water and the organic acid, and valves can be used to provide the appropriate mixture of the cooling fluid. U.S. patent application Ser. No. 08/249,815 referenced above discloses such a system. In an example of this type, a flow meter can be used to set the quantity of cooling fluid being applied to the grinding wheel 22 to get the desirable pH level.

Figure 4:
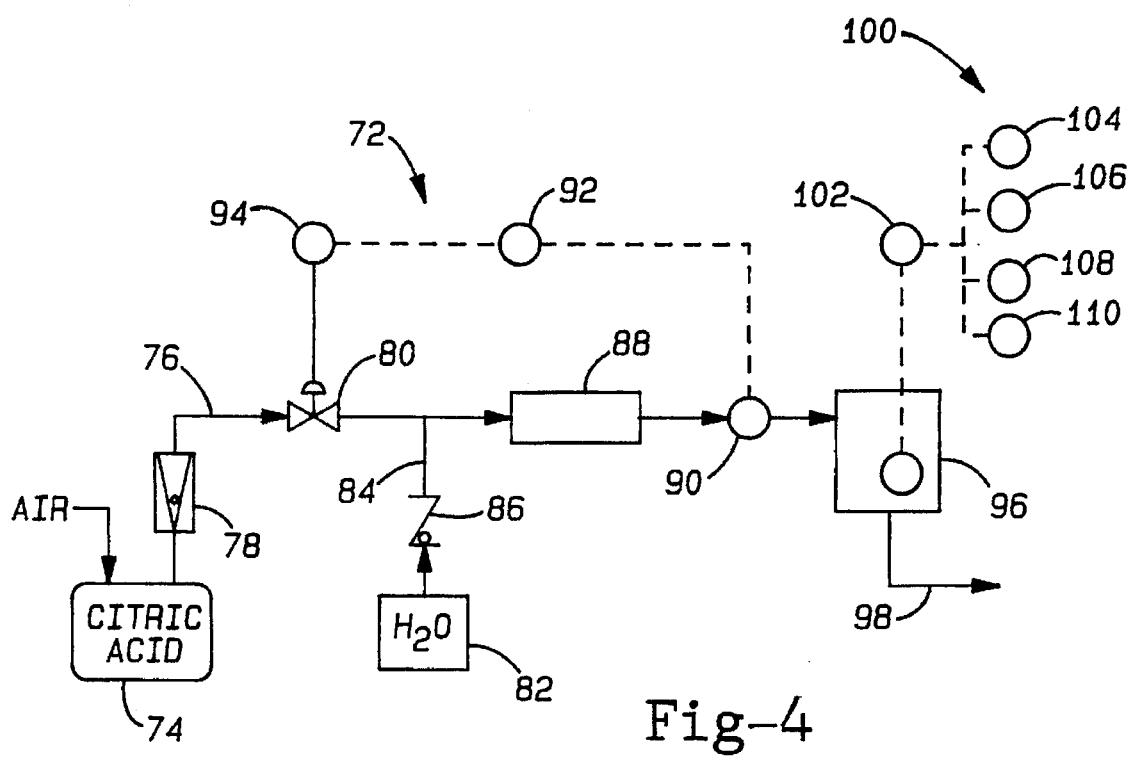
FIG. 4 is a schematic plan view of an organic acid cooling fluid source and pH level sensor according to an embodiment of the present invention.

FIG. 4 shows a schematic plan view of a system 72 that monitors the pH level of a cooling fluid applied to a grinding operation of the invention. Compressed air applied to a reservoir 74 containing a citric acid causes the citric acid to be introduced into a fluid line 76 through a check valve 78. The citric acid is pumped through the line 76 under the influence of the compressed air through a control valve 80 that controls the flow of citric acid through the line 76. Deionized water from a reservoir 82 is applied to a fluid line 84 through a check valve 86. Deionized water from the fluid line 84 and citric acid from the fluid line 76 are combined in a static mixer 88 to get an accurate solution of citric acid and deionized water for cooling purposes.

The mixture of deionized water and citric acid is then sent through a first flow through pH sensor 90. The pH sensor 90 monitors the pH level of the mixture, and provides an electrical signal indicative of the pH level of the mixture to a pH controller 92. The pH sensor 90 and the pH controller 92 are commercially available items such as the ISI Model 11-3KTC pH Sensor and the Lakewood 1020-SM pH Controller, respectively. Of course, other applicable pH sensors and controllers can be used. The pH controller 92 is precalibrated to monitor a particular level of pH in the mixture such that if the pH level as sensed by the sensor 90 varies outside of a predetermined threshold, a valve controller 94 will adjust the control valve 80 to increase or decrease the flow of citric acid in the line 76 to appropriately adjust the pH level of the mixture. The combination of the valve controller 94 and the control valve 80 is a commercially available unit and can be the CASHLO STI-VIJ-7-3IA10AODC.

The mixture is then applied to a second pH sensor 96 before it is applied to the grinding process through line 98 as the cooling fluid 52. The pH sensor 96 sends an electrical signal to a pH alarm system 100, that includes a pH analyzer 102. The pH analyzer 102 is a commercially available item such as the Lakewood H20-PH-42-S1. If the analyzer 102 determines that the pH level is outside a desirable pH level, the analyzer 102 will send a signal to one of four alarm relay switches depending on the pH level. For example, a first relay switch 104 provides an alarm signal if the pH level is very high, a second relay switch 106 provides an alarm signal if the pH level is moderately high, a third relay switch 108 provides an alarm signal if the pH level is moderately low, and a fourth relay switch 110 provides an alarm signal if the pH level is very low. In this manner, operators of the grinding process will be aware of problems with the cooling fluid before incurring scrap parts.

The foregoing discussion discloses and describes merely exemplary embodiments of the present invention. One skilled in the art will readily recognize from such discussion, and from the accompanying drawings and claims that various changes, modifications and variations can be made therein without departing from the spirit and scope of the invention as defined in the following claims.

What is claimed is:

1. An apparatus for grinding a backside surface of an integrated circuit wafer, said apparatus comprising:

a grind chuck table, said grind chuck table including a plurality of holes, said grind chuck table further including a cushion pad secured to a surface of the grind chuck table, said cushion pad including a plurality of holes that are aligned with and in vacuum communication with the holes in the grind chuck table, said grind chuck table further including vacuum means for applying vacuum suction through the plurality of holes in the grind chuck table and the cushion pad so as to secure the wafer to the grind chuck table such that a frontside surface of the wafer is positioned against the cushion pad and a backside surface of the wafer is exposed to be grinded, said cushion pad providing cushioning that is effective to prevent damage to integrated circuits on the wafer during a grinding process; and means for providing a cooling fluid to the grind chuck table, said cooling fluid preventing residue released from the wafer during the grinding process from adhering to the wafer.

2. The apparatus according to claim 1 wherein the cushioned pad is a rubber pad that is approximately 0.027 of an inch thick.

3. The apparatus according to claim 1 wherein the cooling fluid includes a citric acid.

4. The apparatus according to claim 1 wherein the cooling fluid has a pH of about 3.5–5.5.

5. The apparatus according to claim 4 wherein the cooling fluid has a pH of about 4.0.

6. The apparatus according to claim 4 wherein the cooling fluid includes an organic acid selected from the group consisting of citric acid, succinic acid, glutaric acid, adipic acid, formic acid, acetic acid, malic acid, malonic acid, oxalic acid and fumaric acid.

7. The apparatus according to claim 1 wherein the means for providing a cooling fluid includes means for mixing an organic acid and a deionized water to provide the cooling fluid, said means for providing a cooling fluid further including a first pH sensor that measures the pH level of the cooling fluid and a controller that controls the amount of organic acid that is mixed with the water depending on the pH level measured by the first pH sensor.

8. The apparatus according to claim 7 wherein said means for providing a cooling fluid further including a second pH sensor, a pH analyzer and a plurality of alarm switches, wherein the second pH sensor provides a signal to the pH analyzer indicative of the pH level of the cooling fluid, said pH analyzer providing a signal to an alarm switch if the pH level of the cooling fluid is outside of a predetermined threshold.

9. The apparatus according to claim 1 wherein the integrated circuit wafer is a silicon wafer, said cooling fluid preventing silicon residue released from the wafer during the grinding process from adhering to metallic bond pads associated with the wafer.

10. An apparatus for grinding a backside surface of integrated circuit silicon wafers, said apparatus comprising:

a plurality of grind chuck tables, each of the grind chuck tables including a plurality of holes, each of the grind chuck tables further including a rubber cushion pad secured to a surface of the grind chuck tables, each rubber cushion pad including a plurality of holes that are aligned with and in vacuum communication with the holes in the grind chuck table, each of the grind chuck tables further including vacuum means for applying vacuum suction through the plurality of holes in the grind chuck table and the cushion pad so as to secure the silicon wafers to the cushion pads such that a frontside surface of the wafers is positioned against the cushion pad and a backside surface of the wafers are exposed to be grinded, said cushion pad providing cushioning that is effective to prevent damage to integrated circuits on the wafer during a grinding process; and means for providing a cooling fluid to the grind chuck tables, said means for providing the cooling fluid including at least one pH sensor for sensing the pH of the cooling fluid, said cooling fluid being a mixture of a citric acid and deionized water, wherein the citric acid prevents residue released from the wafer during the grinding process from adhering to metal bond pads of the wafer.

11. The apparatus according to claim 10 wherein the cooling fluid has a pH of about 3.5–5.5.

12. An apparatus for providing cooling fluid to a grinding machine that grinds an integrated circuit wafer, said apparatus comprising:

a source of organic acid;

a source of deionized water;

mixing means for mixing the organic acid with the deionized water in a predetermined mixture so as to provide a cooling fluid having a predetermined pH;

a first pH sensor, said first pH sensor providing a signal indicative of the pH level of the cooling fluid mixture;

a pH controller responsive to the pH level signal from the first pH sensor, said pH controller controlling a flow of the organic acid so as to control the pH level of the mixture of the cooling fluid;

a second pH sensor, said second pH sensor also sensing the pH level of the mixture and providing a signal indicative of the pH level of the mixture;

a pH analyzer responsive to the pH level signal from the second pH sensor;

a plurality of alarm switches, said pH analyzer providing a signal to the plurality of alarm switches if the pH level of the mixture is outside a predetermined range; and means for directing the cooling fluid to the integrated circuit wafer.

13. A method of grinding a backside surface of a wafer where a frontside surface of the wafer includes a plurality of defined integrated circuit chips, said method comprising the steps of:

providing a grind chuck table, said step of providing a grind chuck table including the step of securing a cushioned pad to a grind surface of the grind chuck table, said step of providing a grind chuck table further including the step of providing a plurality of holes through the grind chuck table and the cushion pad where the holes in the grind chuck table and the holes in the cushion pad are aligned and are in a fluid communication with a vacuum source;

securing the wafer to the grind chuck table such that the frontside surface of the wafer is positioned against the cushioned pad and the backside surface of the silicon wafer is exposed for grinding, said step of securing the wafer to the grind chuck table including using the vacuum source to provide suction against the front side surface of the wafer through the plurality of holes in the grind chuck table and the cushion pad, said cushion pad providing cushioning that is effective to prevent damage to integrated circuits on the wafer during a grinding process;

moving the grind chuck table relative to a grinding surface so as to remove portions of the wafer; and cooling the grind chuck table and grinding surface with a cooling solution.

14. The method according to claim 13 wherein the step of providing a cushioned pad includes providing a rubber pad that has a thickness of about 0.027 of an inch.

15. The method according to claim 13 wherein the step of cooling with a cooling solution includes using a cooling solution having an organic acid to make the cooling solution have a pH less than about 5.5.

16. The method according to claim 13 wherein the step of cooling includes providing a cooling solution including a citric acid causing a pH of the solution to be about 3.5–5.5.

17. The method according to claim 13 further comprising the steps of providing a pH sensor, using the pH sensor to sense the pH level of the cooling solution and generate a signal indicative of the pH level of the cooling solution, providing a pH controller responsive to the pH signal from the pH sensor, and controlling a flow of organic acid that is mixed with the cooling solution so as to control the pH level of the cooling solution.

18. The method according to claim 13 further comprising the steps of providing a pH sensor, using the pH sensor to sense the pH level of the cooling solution and generate a signal indicative of the pH level of the cooling solution, providing a pH analyzer responsive to the pH signal from the pH sensor, and providing a signal to an alarm if the pH level of the cooling solution is outside a predetermined range.

19. The method according to claim 13 wherein the step of cooling the grind chuck table with a cooling solution includes using a cooling solution having an organic acid that is selected from the group consisting of citric acid, succinic acid, glutaric acid, adipic acid, formic acid, acetic acid, malic acid, malonic acid, oxalic acid and fumaric acid.

* * * * *